United States Patent [19]

Lindberg

[11] 4,308,339
[45] Dec. 29, 1981

[54] METHOD FOR MANUFACTURING TAPE INCLUDING LEAD FRAMES

[75] Inventor: Frank A. Lindberg, Catonsville, Md.

[73] Assignee: Westinghouse Electric Corp., Pittsburgh, Pa.

[21] Appl. No.: 119,247

[22] Filed: Feb. 7, 1980

[51] Int. Cl.³ ............................................. C23F 1/02
[52] U.S. Cl. ..................... 430/312; 29/576 S; 156/644; 156/661.1; 357/70; 430/318
[58] Field of Search ............................... 357/65, 67–71; 29/576 S; 174/52 R; 156/640, 644, 654, 656, 659.1, 661.1, 901; 430/312, 313, 316, 318, 319, 333, 314

[56] References Cited

U.S. PATENT DOCUMENTS

| | | | |
|---|---|---|---|
| 3,222,173 | 12/1965 | Belko et al | 430/312 X |
| 3,264,105 | 8/1966 | Houtz | 430/312 |
| 3,324,530 | 6/1967 | Sherwood et al. | 430/312 UX |
| 3,671,243 | 6/1972 | Campbell et al. | 355/89 X |
| 3,716,761 | 2/1973 | Rotast | 174/68.5 X |
| 3,793,714 | 2/1974 | Bylander | 29/583 |
| 3,813,310 | 5/1974 | Droege et al. | 156/644 X |
| 3,838,984 | 10/1974 | Crane et al. | 174/52 PE |
| 3,882,597 | 5/1975 | Chayka et al. | 29/624 |
| 3,968,563 | 7/1976 | Hamlin | 29/591 |
| 3,984,620 | 10/1976 | Robillard et al. | 174/52 FP |
| 4,007,479 | 2/1977 | Kowalski | 357/70 |
| 4,056,681 | 11/1977 | Cook | 174/52 FP |
| 4,056,681 | 11/1977 | Cook | 174/52 FP |
| 4,079,509 | 3/1978 | Jackson et al. | 29/589 |
| 4,089,733 | 5/1978 | Zimmerman | 156/630 |
| 4,139,434 | 2/1979 | Dugan | 156/644 X |
| 4,210,926 | 7/1980 | Hacke | 357/70 |

Primary Examiner—William A. Powell
Attorney, Agent, or Firm—H. W. Patterson

[57] ABSTRACT

A metallic lead frame strip, method of manufacturing same, a test tape, a method of testing together with the art work for same is disclosed. The method of manufacturing includes a method for producing art work that provides for accuracy in etching both sides of the lead frame strip simultaneously and permits a highly accurate positioning of the bonding bumps of at least one integral bonding bump for each lead and also discloses leads having a plurality of bonding bumps for connecting electrically common portions of a chip to be tested. Also, the use of registration aids are disclosed which allow lead bumps to be registered to chip pads even though the bumps cannot be seen in the alignment step. The testing of the chip also includes a method and double-layer test strip that may be used repeatedly for testing successively larger chips having an increasing number of individual leads.

10 Claims, 15 Drawing Figures

FIG. I

METHOD FOR MANUFACTURING TAPE INCLUDING LEAD FRAMES

BACKGROUND OF THE INVENTION

1. Field of the Invention

The present invention relates to tape bonding and testing of integrated circuits utilizing multi-layer testing tape and single-layer lead frame tape having integral bonding bumps and the method of manufacture of such lead frames.

2. Description of the Prior Art

In the interconnection of integrated circuit chips by the tape bonding approach, a number of conductive leads are bonded to the chip at appropriate points for suitable electrical connection to a hybrid substrate, for example. Because of the extremely small size of integrated circuits, the conductive leads are usually manufactured in what may be termed a lead frame configuration. This configuration is an elongated conductive tape having a row of registration or sprocket openings along one or both edges with a number of spaced lead frames positioned along the tape relative to the openings and between the rows. Each frame includes spaced metallic leads that are integral at one end with its frame and project inwardly in the same plane in numbers and direction for the inner free ends of the leads to register with and engage bonding pads on the chips. The chips may be positioned by any standard machine in the frames and bonded to the inner free ends of the leads thereof. With this tape bonding approach the chips may be then tested using a separate multi-layer test tape that provides proper lead isolation.

This single layer metallic lead frame tape is by its very nature simple to manufacture when compound to the conventional multi-layered lead frame tape. However, the multi-layered tape has isolated leads that permit testing of the chip subsequent to bonding; whereas the leads of the single layer tape are shorted together and require an isolation step in the event the chips are to be tested.

It is preferable for many applications, that the inner or free end of each of the leads of a lead frame of the tape or strip have a thicker spot than the remainder of the lead. Such thicker or raised portions are referred to as bonding bumps, and are compressed in contact at an elevated temperature with the appropriate bonding pads of an integrated circuit chip. The bonding machine simultaneously bonds the leads securely to the circuit chip bonding pads. In manufacturing such lead frame strips having the integral raised bonding bumps, it is desirable to spray etch the strip of metal foil that constitutes the tape on both sides simultaneously to produce the desired configuration. In such etching, both sides of the metal foil are protected with photoresist which is imaged with appropriate art work. The features of the art work pattern or image on one side of the foil strip must accurately register with its corresponding features on the opposite side of the foil strip to within several tenths of a mil; and any misalignment or excessive tolerance results in a defective tape.

To prevent any misalignment that would render the lead from tape defective, the manner in which the necessary art work is prepared and utilized is critical. Also, because of the increasing miniaturization of integrated circuits, problems may be encountered in using standard photolithographic techniques. For example, lens distortion in reducing the size of the art work to the actual size required for the lead frame may result in excessive misalignment, particularly where the bonding bumps are integral with the free ends of each of the individual leads of the frame. Also, once the lead frame tapes are manufactured, such extreme miniaturization also requires accurate alignment of the chip with the bonding bumps on the leads of the frame for the actual bonding process, which is difficult to achieve uniformly.

Once the leads of each frame are bonded via their integral bonding bumps to the bonding pads of the IC chip, it is desirable to test the chips prior to incorporation in its ultimate circuit. With the single layer foil tape described thus far this is not possible since all the leads are shorted together. Testing must be done on a tape which is constructed such that the leads are supported by an insulating carrier to provide electrical isolation. This type of tape is more difficult to make, especially with integral lead bonding bumps, since multiple etching steps are required, i.e. for etching the metal and etching the insulating carrier.

Although lead frames, wherein each etched conductive lead has a single, deformable bonding bump on the free end thereof, is satisfactory for bonding to the pads of most IC circuit chips, they do not appear to be satisfactory where the bonding bumps on extremely small bonding pads of the chip are very closely spaced. For example, if the leads are cantilevered for long distances such as fifty times their width, then they may bend so that the array of bonding bumps on the leads will no longer register with the corresponding array of bonding pads on the chip. Also, spray etching of such fine cantilevered leads is difficult because the force of the spray may bend the leads. Further, slight variations in the widths of the fine line leads of the frame due to etching tolerances produce leads of varying impedances. It is desirable to provide a method of testing and a test tape configuration that does not require customizing for each different chip and may be used repeatedly for testing increasingly larger sized chips.

SUMMARY OF THE INVENTION

In accordance with the present invention, there is provided a method of manufacturing single layer lead frame tapes wherein the leads of each frame have at least one integral bonding bump adjacent their free ends for bonding to pads of an integrated circuit chip. For electrical isolation, such a tape may be utilized with a two-layer test tape having one layer constituting an insulated carrier strip with spaced sprocket openings along one or both sides thereof, and another layer that constitutes a plurality of coplanar conductive sets that correspond at least to the number of planar directions that the leads of an integrated circuit chip to be tested may extend.

In one aspect, in manufacturing the single layer lead frames, an enlarged art work pattern that represents a selected lead frame configuration is generated on a transparent sheet, and another enlarged pattern that includes a representation of the size and orientation of the bonding bumps for such lead frame configuration is generated in alignment such that the first and second patterns may be superimposed one on top of the other in proper registration. After appropriate photoreduction, the two art work images are stepped and repeated together to provide a master negative. This negative is then cut down the middle between the strings of patterns and glued together adjacent the cut to form an open-sided envelope, emulsion facing emulsion with the pattern for one side facing the other pattern on the other side in registration. A blank conductive tape having a photoresist on both sides thereof is then inserted between the superimposed first and second patterns and imaged. The tape is then etched for a time that is sufficient to etch completely through those areas that have no photoresist in alignment on either side and to etch partially those areas having photoresist on only one side, while leaving at substantially full thickness those areas having photoresist in alignment on both sides of the tape.

In a more specific aspect, the step of producing the second pattern that includes the position and orientation of the bonding bumps includes producing an additional reference pattern portion positioned in predetermined spaced relation from the bonding bump portions to render a partially etched portion exterior of the location of the chip and spaced from the bumps that is visible for registration with a predetermined visible reference point on the chip to be bonded. Such reference pattern may have an inner edge corresponding in position and contour to a portion of the peripheral surface of a chip to be bonded.

In another aspect, the conductive single-layer lead frame tape with its bonded chips is then aligned via its sprocket openings with the sprocket or registration openings of a two-layer test tape, so that each of the lead frames with its bonded chip is in proper registration with the test tape leads. Once the individual leads of the lead frames are bonded to the associated leads of the test tape, then the excess portion of the tape with the bonding tool still in position may be stripped from the test tape leaving the two-layer test tape with the chips bonded thereto by its individual leads. Once the chips are tested, a suitable device severs the chips adjacent the outer ends of its individual leads from the test tape. The test tape is so configured that it can be used for a number of different chips having appropriately spaced bonded leads and then may be reused for increasingly larger chips having an equal or greater number of leads than the previously used chips by merely increasing the size of the central opening of the test tape a desired amount.

In still another aspect, the lead frame manufactured in accordance with the present invention may include a plurality of bonding bumps on each individual lead in order to provide a parallel connection of the bonding pads of an appropriate integrated circuit chip.

DESCRIPTION OF THE PREFERRED EMBODIMENT

In the method of the present invention, metallic lead frames for semiconductor chips are manufactured by spray etching from both sides, an elongated strip or tape of material, such as metal foil somewhat wider than the desired width, in order to form the leads, bonding bumps, tape edges, registration aids, part numbers, and sprocket holes. The individual lead frames are repeated at predetermined spaced intervals along the length of such tape with spaced registration or sprocket openings adjacent opposite side edges to engage with teeth in sprocket wheels of a conventional device for placing each lead frame in the proper position for bonding or other processing operations.

The art work producing cycle begins by taking the actual chip to be bonded and measuring the location of the bonding pads to produce a drawing on a 100 to 1 scale which, of course, provides extremely large art work spots that correspond to the actual photoresist bonding bump spots for the leads. This art work is then photographically reduced to 25 to 1 and the lead layout is then made at this scale.

Figure 1:
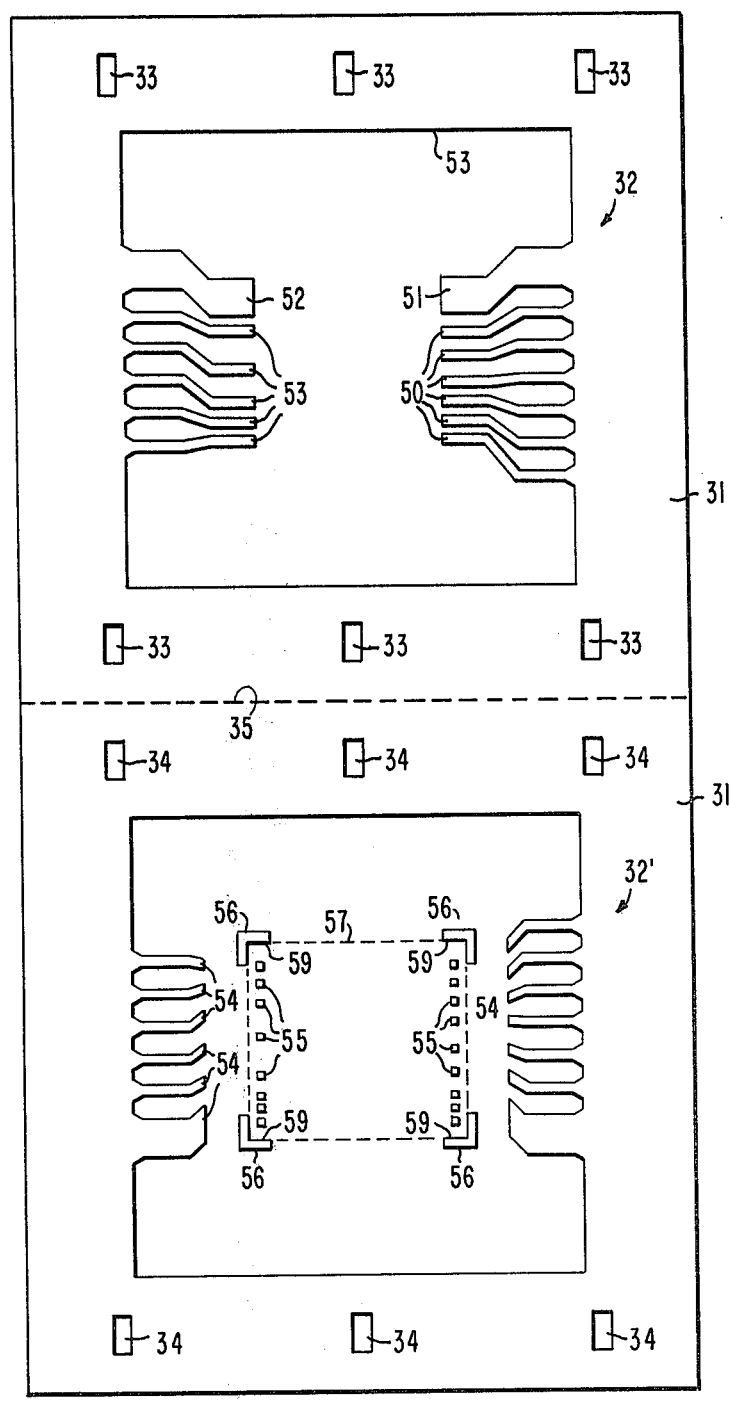
FIG. 1 is a plan view of a sheet of material illustrating the art work thereon for the manufacture of a metallic lead frame in accordance with the present invention.

Referring to FIG. 1, an enlarged art work image for both sides of a single-lead frame configuration, generally referred to as 30, is outlined on a transparent sheet of material, such as vinyl, for example, referred to at 31. The image for exposing the photoresist on one side of the metallic foil tape is referred to at 32 and the image for exposing the photoresist for the same lead frame on the opposite side of the metallic foil strip is referred to at 32'. The art work for the sprocket openings of the metallic strip is referred to at 33 for one side thereof and the art work for the sprocket openings on the opposite side of the strip are referred to at 34. Thus, the images 32 and 32' as well as the sprocket opening images 33 and 34 must be accurately aligned with respect to each other so that when the sheet material 31 is folded along a dashed line such as 35, for example, the sprocket opening images 33 and 34 and the art work images 32 and 32' will be in the proper registration for exposing the photoresist.

Figure 2:
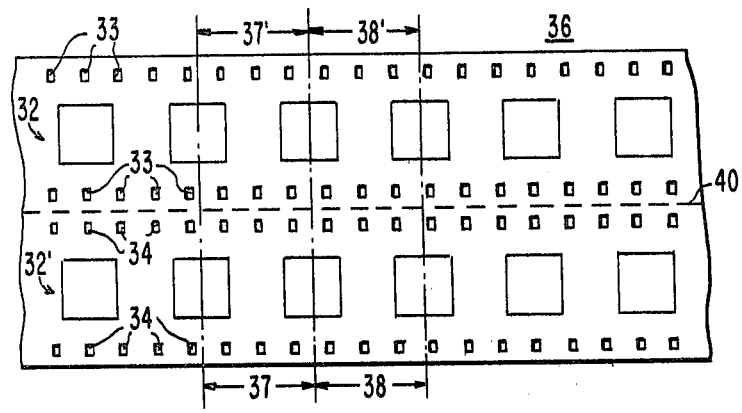
FIG. 2 illustrates a fragmentary portion of a transparent sheet having the art work thereon for superimposing the art work for one side of the metallic lead frame and the art work for the opposite side of the metallic lead frame.

After the layout is complete as described, the two images are photographically reduced to actual scale, or whatever scale is desired with respect to the required actual size of the individual lead frames of the strip; and then both images on the sheet are stepped and repeated together to generate a double string of images, such as shown in FIG. 2. The art work image 32 of a lead frame that exposes the photoresist on one side of the metallic strip must register accurately with the art work image 32' that exposes the photoresist for the same lead frame on the opposite side of the strip. However, the spacing between successive sets of images after they have been stepped and repeated need not register to the same high degree of accuracy. Referring to FIG. 2, a fragmentary portion of a length of an emulsified strip 36 is shown that has been subjected to the step and repeat process and then developed to space the sprocket holes 33 and 34 and the images 32 and 32' in sequence along the length of such strip. In accordance with the present invention, any inaccuracies in the step and repeat mechanism is compensated for by the arrangement of the art work image as shown in FIG. 1 when applied to the emulsified strip 36. For example, a distance referred to as 37 must be the same as the distance referred to as 37' as shown in FIG. 2; and the distance referred to at 38 must be the same as the distance referred to at 38' in order to provide the proper registration of the images 32 and 32'. However, the distances 37 and 38 may be different with respect to each other as may be caused by tolerances in a step and repeat mechanism. Thus, when the upper image 32 is superimposed on the lower image 32', by folding the strip 36 along a dashed line such as 40 for example, all of the images 32 and 32' along said strip are in proper registration with respect to each other.

Figure 3:
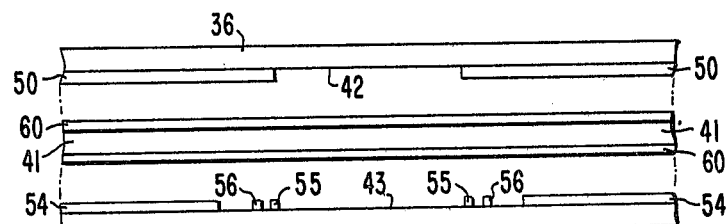
FIG. 3 is a cross-sectional view of the sheets of material of FIG. 1 or 2 illustrating the art work applied to such sheets, and being separated to more clearly illustrate the registration of the art work.
Figure 4:
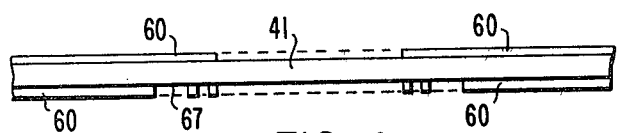
FIG. 4 is a cross-sectional view of a metallic lead frame strip having the photoresist applied thereto and utilizing the superimposed art work of FIG. 3.
Figure 5:
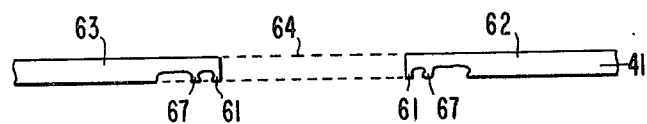
FIG. 5 is a cross-sectional view of a metallic strip that has been etched in accordance with the present invention.

Prior to discussing the details of the configuration of the art work for the lead frames and the resulting lead frames in accordance with the present invention, reference is made generally to FIG. 3 which illustrates a metallic foil strip 41 interposed between emulsified surfaces 42 and 43 when the art work sheet 30 or 36 is folded on the dashed line such as 35 of FIG. 1 or 40 of FIG. 2, respectively. At this point of the description, and with reference generally to FIG. 4 it is sufficient merely to mention that the conductive sheet 41 after being exposed to the photoresist is properly prepared for the etching process. FIG. 5 illustrates the etched out portions of a section of the metallic piece 41 in accordance with the application of the photoresist.

Figure 6:
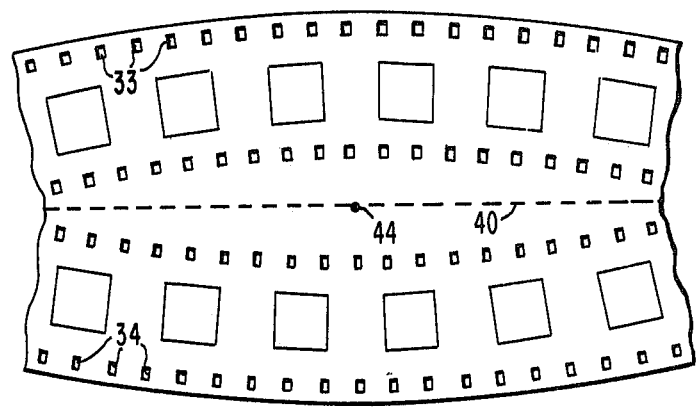
FIG. 6 illustrates a typical bowed-out arrangement caused by lens distortion when photo reducing the art work for contact printing of a metallic lead frame on both sides thereof.
Figure 7:
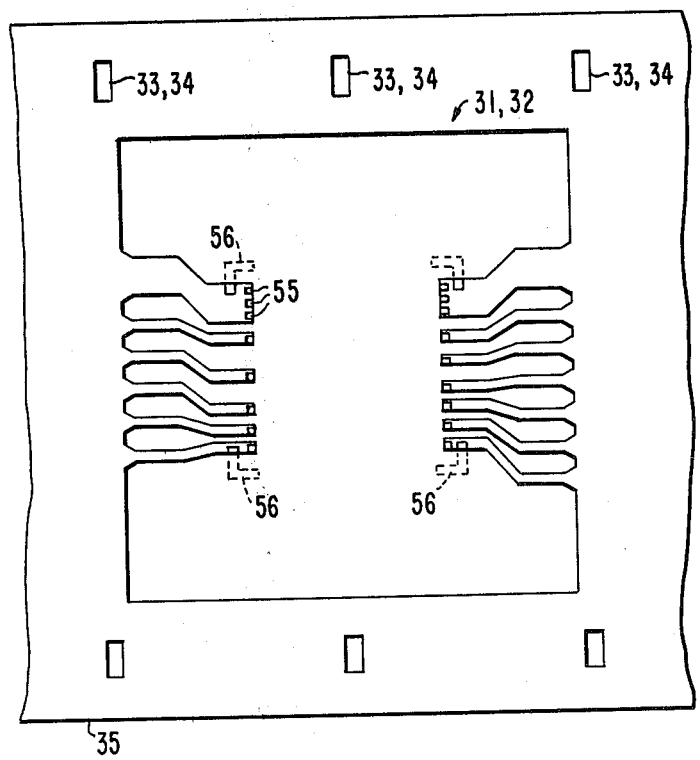
FIG. 7 illustrates the art work for both sides of a metallic lead frame superimposed to illustrate the registration of features in the manufacture of a metallic lead frame in accordance with the present invention.

Referring generally to FIG. 6, if the art work images for the individual lead frames are extremely small it may be desirable to accomplish the step and repeat operation at an enlarged size and then photoreduce the elongated strip such as is shown in FIG. 2 to the actual miniaturized scale. Since the images 32 and 32' spaced along the strip 36 (FIG. 2) are reduced at the same time then each image experiences exactly the same reduction. However, due to lens distortion the reduced series of images will bow out at the center as shown in FIGS. 6 and 7; or they may bow in a similar manner (not shown). With symmetrical lens distortion by centering the camera at the center of the strip, such as represented at 44 the distortion effectively cancels out and the strip of images that include the lead frames 32 and the strip of images that include the lead frames 32' will superimpose in the proper registration when the strip is folded along the line such as 40. Thus, there has been described a method of producing a pair of step and repeat images by stepping the image corresponding to one side of the metallic lead frame strip and the image corresponding to the other side of the metallic lead strip at the same time such that each corresponding pair of images in the sequence experience the same size step; and therefore, each image of one series of images accurately superimposes with the corresponding image of the other series of images. Also in accordance with the present invention such a strip of images may be photoreduced with a line of symmetry (40) of each pair of images 32 and 32' coinciding with the line of symmetry of a camera lens such that the reduced images though distorted is still symmetrical and therefore provides a series of superimposed images when cut and folded about its line of symmetry.

Referring again to FIg. 1, the art work 32 for one side of the metallic lead frame strip referred to at 32 includes a plurality of spaced leads referred to at 50 and a pair of spaced leads referred to at 51 and 52 respectively. It is understood, that the area within the continuous line 53 that forms the boundary and the individual leads of the frame is to be etched away during the etching process. Similarly, the openings 33 are also to be completely etched through the metallic lead frame strip. The art work image 32' which constitutes the pattern for exposing the photoresist to the opposite side of the metallic strip is comprised of a plurality of leads 54 which superimpose on the respective leads 50, 51 and 52 except that the leads 54 do not extend to the inner or free ends of the leads 50, 51 or 52. The image 32' also has a plurality of small spots 55 that correspond to the position of the bonding bumps at the inner or free end of the leads. Because of the extremely small size of the chip and the individual bonding pads thereon it is important that the bonding bumps align perfectly with its corresponding chip bonding pads even though such bonding bumps may be slightly offset at the end of its particular lead. In this respect, an additional art work feature such as 56, for example, may be provided on the same art work 32' as that art work which locates the bumps 55. The outline of the chip which would be utilized with the completely etched metallic foil lead frame is shown at 57 and its inner edges such as 59. Art work 56 may correspond to the outline of the corners of such chip, for example. Thus, the additional features 56 are on the same art work 32' as the art work which locates the bumps 55 and thus are always in the same registration with respect to each other even though the entire art work image 32' may not have perfect registration with the art work image 32. Although in the present embodiment the additional registration features 56 are shown as corresponding to the outline of the four corners of the chip, such art work may correspond to other recognizable features of the individual chip or include fewer corners.

Referring to FIG. 7 which shows the art work image 32 superimposed on the art work image 32', when folded along the line of symmetry 35, illustrates the registration of the two images as far out of alignment as is permissible; that is, the bumps 55 are still aligned with the ends of the leads 50, 51 and 52 but slightly displaced from center as shown therein. It will be noted that the features 56 shown in dotted lines of FIG. 7 are slightly displaced relative to the edges of the leads 50, 51 and 52 but are still accurately spaced with respect to the art work images 55 for the bonding bumps.

Once the art work such as shown in FIGS. 1, 2 or 6 has been completed, the upper images 32' are severed from the lower images 32' as shown in the drawings along their respective lines 35 or 40, and placed in proper registration, emulsified surface 42 and 43 (FIG. 3) opposing each other to form an envelope, for example, or with the foil tape placed therebetween.

The lead frame strip, which previously has been coated with a photoresist and properly exposed as previously described, is ready for etching. To complete the metallic lead frame strip, it is preferably spray etched, but may be immersed in the etching solution a sufficient length of time so that those areas where the art work is absent on both sides of the strip are completely etched away; those particular areas in which the art work is present on only one side of such strip is etched approximately half of the thickness of the strip; and in the particular areas where the art work on the image 32 overlaps the art work on the image 32', the metallic foil retains its original thickness.

Figure 8:
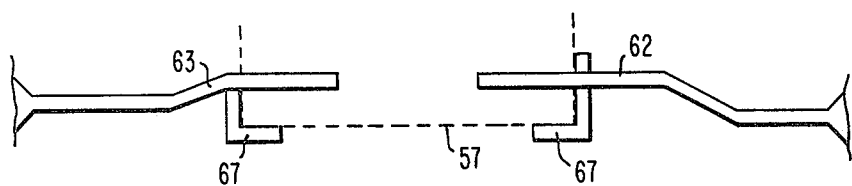
FIG. 8 is an enlarged fragmentary view of opposing leads of a metallic lead frame illustrating reference areas for the positioning of an integrated circuit chip in accordance with one embodiment of the present invention.

Referring again in more detail to FIG. 3, which is a cross-section of the emulsified strip 36, for example, showing superimposed the art work of FIG. 7, only shown slightly spaced from one another for clarity with the typical metallic strip 41 interposed; it is to be noted that the art work 50 which corresponds to the leads of the lead frame registers with the art work 55 that corresponds to the bonding bumps for the lead frame. The feature 56 is illustrated to register with the lead frame 50 as more clearly shown in FIG. 7. As shown in FIG. 4, the metallic lead frame cross-section is shown with those portions in dotted lines where no photoresist exists after development on the two sides and shown in solid lines where the photoresist 60 remains. As shown in FIG. 5 a bonding bump 61 is formed at the inner end of lead frame 62 and 63 respectively with the central portion 64 shown by the dashed lines being fully etched away. Similarly, the additional features 67 for proper registration of the chip 57 where it overlaps the lead 62 and 63 remains the full thickness of the metallic strip. It is also to be noted that the remaining portion of the lead of FIG. 5 exterior of the feature 56 is full thickness where art work 50 and 54 overlapped to prevent exposure of the photoresist on the metallic lead frame. With reference to FIG. 8, there is shown an enlarged plan view of a fragmentary portion of leads such as 62 and 63 to show the additional feature 67 (FIG. 5) integral therewith for registration with a chip, the outline of which is partially shown and referred to at 57. With a registration feature 67 on the metallic foil lead frame strip, positioned to bound each of the chip corners, the degree of over etching or under etching is not critical since the chip edges are centered between the registration features so as to produce a uniform gap at each corner of the chip. Also, the bonding bumps 61 (FIG. 5) cannot be seen from the top side when the chip is positioned for bonding in the central opening of the frame, the registration feature is viewable because it protrudes from beneath the individual leads and registers with the corners of the chip.

To summarize the discussion thus far, there has been shown and described a pair of art work images and the technique for making a metallic lead frame strip from these lead frame images. The first of the pair of images defines the set of leads which comprise a lead frame and the second of the pair defines the location of the bonding bumps at the inner or free ends of each of the leads. Additional registration features on the second of the pair which protrude away from the outline of the leads of the first of the pair and therefore are visible when viewed from the top side of the resulting metallic lead frame has been described. The additional art work features are made to register with some visible recognizable feature of the integrated circuit chip to which the bonding bumps of the metallic lead frame strip will ultimately be bonded. Thus, a strip of gang bonding lead frames which can be registered to integrated circuit chips has been provided without the need to be able to view the chip bonding pads or the lead bonding bumps.

When gang bonding the lead frames having integral raised bumps at the inner or free ends of each of the leads, the raised soft metal bonding bumps plastically deform when thermal compression bonding occurs. If the chip is exceeding small, and the bonding pads on the chip are very closely spaced such as is the case with a field effect transistor chip, it then becomes difficult to use the tape bonding process. It is not only difficult to produce the raised bumps on the bonding pads of the chips themselves, it is also difficult to etch very fine closely spaced lead frames with small integral bonding bumps on the free ends thereof. For example, where the fine lines of the lead frame are cantilevered for a long distance they also may bend so that the array of bonding bumps on the leads no longer register with the corresponding array of the bonding pads on the chip. Also, it has been found that spray etching of fine cantilevered lines is difficult because the force of the spray may bend the leads. Further, slight variation in the widths of the fine line lead frame due to etching tolerances produces lines of varying impedances. Thus, in accordance with the present invention an improved lead frame structure is provided which may be made in accordance with the method previously described and overcomes the difficulties mentioned above.

Figure 9:
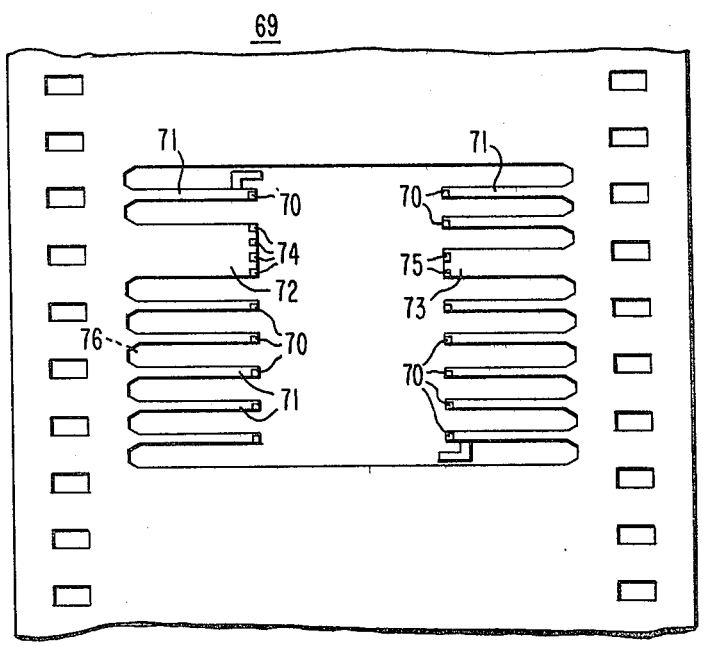
FIG. 9 is a fragmentary plan view of a portion of a metallic lead frame and illustrates individual leads having a plurality of bonding bumps that are common to a given lead to register with pads on an integrated circuit chip which are electrically common to one another.

Referring to FIG. 9, a fragmentary portion of a metallic lead frame strip having integral raised bonding bumps 70 at the free or inner end of leads such as 71, includes a lead 72 and a lead 73, both of which are much wider than the individual leads 71. The leads 72 and 73 each have at their inner or free ends a plurality of spaced bonding bumps 74 and 75 respectively. The bonding bumps 74 and 75 may be utilized to connect a number of bonding pads in common or to connect to a single bonding pad that would be to large for a lead having a single integral raised bonding bump at the end.

Figure 10:
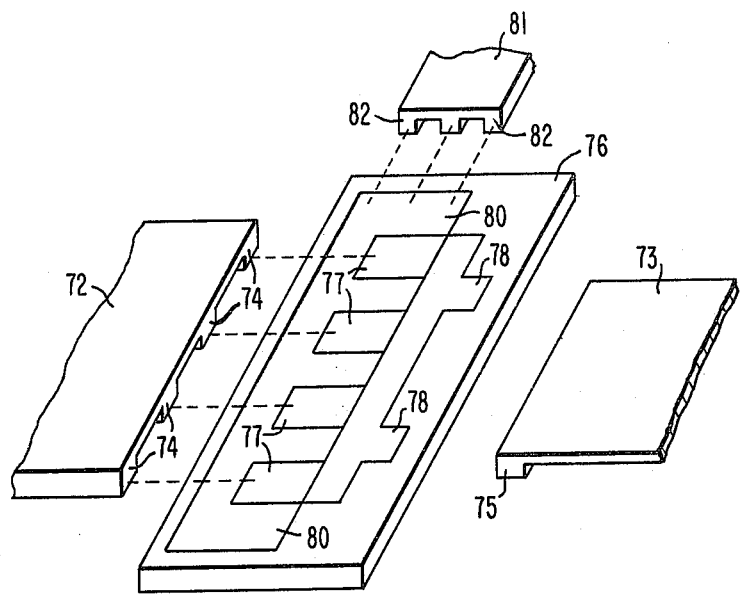
FIG. 10 is pictorial view of an FET chip together with its leads each whereby has a plurality of bonding bumps, said leads being shown spaced from the chips for clarity.

For example, and referring to FIG. 10 a field effect transistor chip 76 having a row of electrically isolated drain pads 77, gate bonding pads 78, and source bonding areas 80, may be successfully bonded to the lead frames having a structure in accordance with the present invention by providing the wide lead 72 with the spaced integral bonding bumps 74 each of which register with a respective drain pad 77 on the chip 76 so that the conductors have precisely the same impedance and thus does not permit the separate drains 77 to be out of phase with respect to one another, for example. A lead such as 81 may be provided that has a plurality of bonding bumps 82 to register with the source bonding area 80, for example. This permits a bonding area which is too large to be bonded with a single large bump to provide the same ratio of bump height to bump width to provide adequate but not excessive bonding pressure on the bonding bumps to produce plastic deformation sufficient for a good thermal compression bond.

After the etching process, as previously described, the metallic foil may be plated with a metal or metal alloy which is compatible with a chip bonding pad metallization, preferably gold, and fed into a conventional inner lead bonding machine. The lead frame such as shown in FIG. 9 may be bonded to the chip by registering the bonding bumps over the bonding site of the chip and then compressing all of the bumps 74, 75 and 82 (not shown in FIG. 9) at elevated temperature. It is understood that the lead frame strip of FIG. 9 may be manufactured and have the additional features as previously described in FIGS. 1 through 8. It is understood, that if it is desired to bond to chips which have been specially manufactured with raised soft metal bonding bumps on the chip's bonding pads then the bonding bumps may be omitted on the above described lead frame tape simply by omitting the spots 55 on the art work. The tape can be made with or without bumps.

Figure 11:
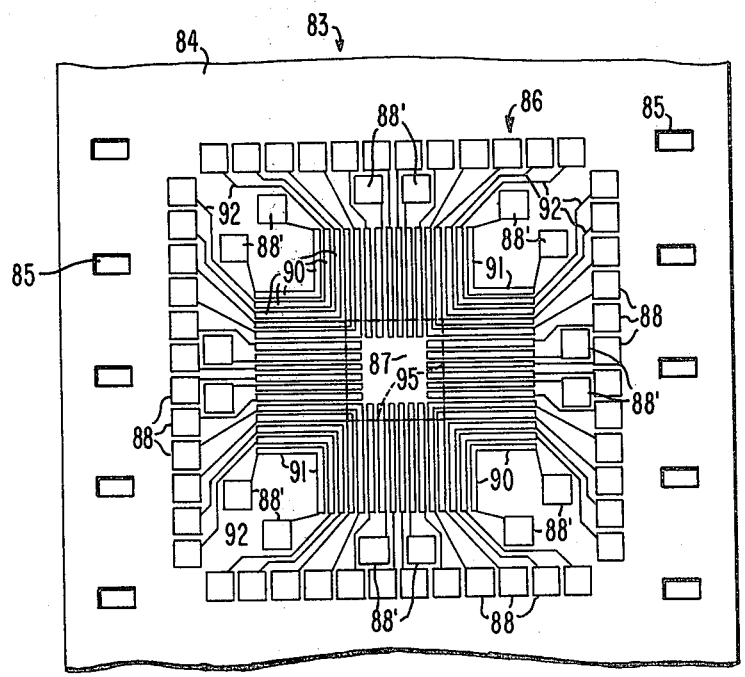
FIG. 11 is a fragmentary portion of a two-layer test frame that is configured to provide capability of testing a number of different-sized integrated circuit chips having various numbers of bonding pads.

Referring to FIG. 11, a two-layer test tape in accordance with the present invention is referred to at 83 and comprises an insulative substrate 84 which is preferably polymide having sprocketing openings 85 therein; and on which is bonded a metallic pattern generally referred to as 86. The insulative tape 84 and the pattern 86 has a central opening 87 which is shown as being rectangular in configuration to accommodate the chip to be tested. The outer perimeter of the pattern 86 is formed by a plurality of metallic squares 88 spaced a predetermined distance apart and arranged in a rectangular configuration to form an outer boundary for the pattern and the central rectangular opening 87, the edges of which central opening 87 is referred to as the inner perimeter or boundary of the pattern 86. Extending at right angles from each edge of the opening 87 and in communication therewith are a plurality of straight parallel-spaced metallic conductors 90 that are electrically isolated from each other. The particular metallic strips 90 that do not intersect the edge of the opening 87 will, at a later time, intersect a larger square opening if such an opening were punched in the center of the pattern 86. It is noted that there are six of the metallic conductors 90 that abut the edges of each side of the opening 87 and an additional ten metallic conductors 90 that do not for the small square opening shown as 87. Thus, there are a total of 16 metallic conductors shown associated with each side of the opening 87 making a total of 64 conductors in all as shown in this example. This sequence can be continued for more than 64 metallic strips (90) and probe pads (88) if desired. Each one of the conductors 90 is connected to a corresponding block 88 by a thin metallic strip such as 92. It is noted that inwardly of the pads 88 to which the test probes are placed in contact for testing an integrated circuit, are a plurality of rectangular metallic pads 88'. These pads are merely to provide a symmetrical arrangement for engaging a test probe without increasing the overall perimeter of the outer boundary of the pads 88. A dashed line 95 of FIG. 11 outlines the manner in which the opening 87 could be enlarged to accommodate a larger size chip than could be accommodated by the opening 87 as shown in FIG. 11 and at the same time provide additional metallic leads 90 that would abut the edge of the opening. The metallic leads 90 are preferably copper plated with an electrodeless tin.

Figure 12:
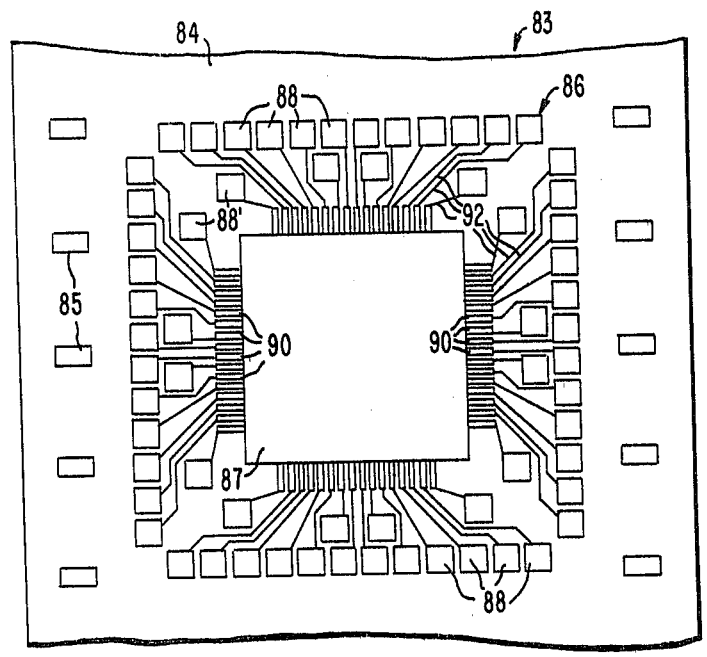
FIG. 12 is a fragmentary view of the test strip of FIG. 13 illustrating the central opening that is enlarged to accommodate a chip of a size larger than could be accommodated with a central opening as illustrated in FIG. 11.

Referring to FIG. 12 the test frame 83 is identical to the test frame shown and described in connection with FIG. 11 except that the opening 87 has been enlarged to its maximum extent such that all of the spaced conductors 90 abut a corresponding edge of the opening 87. Although the test tape inner boundary or opening 87 is shown to approximately its maximum enlargement, it is understood that the opening 87 may be enlarged for each testing operation in intermediate increments. As hereinafter described, the double-layer test tape 83 may be utilized a number of times, first in connection with testing a small size chip and then successively a larger sized chip with additional leads as described.

In testing an integrated circuit chip in accordance with the present invention, the metallic lead frame that is designed for a particular chip is first bonded via its integral bonding bumps at the end of its leads to the corresponding bonding pads on the chip by compression bonding. The lead frame tape (FIG. 9) with the bonded chip (not shown) is then bonded to the conductive lines 90. Since the conductors of the test tape are tin-plated and the lead frame is gold-plated, a gold/tin solder joint is formed between the two copper foils.

At this point the chip cannot be tested because it is evident that all of the leads are shorted together because of the solid metallic foil lead frame strip. Such lead frame strip of course must provide for a specific dimensional relationship of each individual frame to its sprocket openings. With the test tape bonding tool still in place, the excess gold-plated foil is removed leaving the chip bonded to the test tape for testing. In this step, the sprocket holes of the single layer tape such as shown in FIG. 9 are made to register with the sprocket holes of the two layer test tape as shown in FIGS. 11 and 12; and the leads of the lead frame register with predetermined metallic strips 90 on the two-layer insulation tape. The number of bonding pads on the chip to be bonded may be less than or equal to the number of available conductive strips 90 on the test tape 83. To make the most effective use of the test tape, it should first be used with the smaller size chips with fewer bonding pads so that it can be reused for larger sized chips with more bonding pads by merely punching the hole 87 a larger size.

Figure 13:
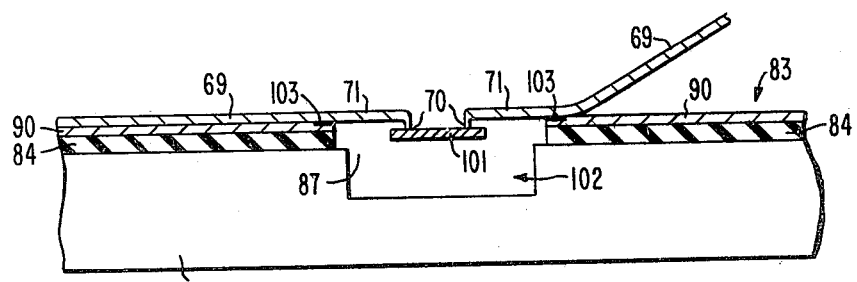
FIG. 13 is a diagrammatic sectional view of a metallic lead frame with a typical integrated circuit attached thereto that is bonded to a test frame strip such as shown in FIG. 11 or 12.

Referring to FIG. 13, a diagrammatic cross-sectional view of a fixture 100 is shown with the test tape 83 having the insulative substrate 84 and showing a metallic strip 90 positioned with the metallic lead frame tap 69 overlying the same such that a chip 101 is spaced so that the central opening 87 of this test tape and a recessed portion 102 are in registration. The individual leads 71 are then bonded at 103 adjacent the edge of the central opening 87 of the test tape to form a compression bond such as a gold/tin soldered joint. This bonding may be any conventional bonding operation but preferably is the formation of a eutectic alloy between different surface metallizations applied to the strips 90 and the leads 71. After the bonding has occurred at 103, with the tool preferably still in position (not shown) the metallic strip 69 is lifted and removed from the test tape where it severs at the outer end of each of the leads. This severing of the individual leads of the lead frame occurs in a ready manner due to the formation of the base end of each of the individual leads. Referring again to FIG. 9, the space between each of the individual leads is configured so that the lead itself fans out at its base to provide a greater strength adjacent such base end so that the weak point 76 of each of the leads 71 is at the outer end of the lead frame.

Figure 14:
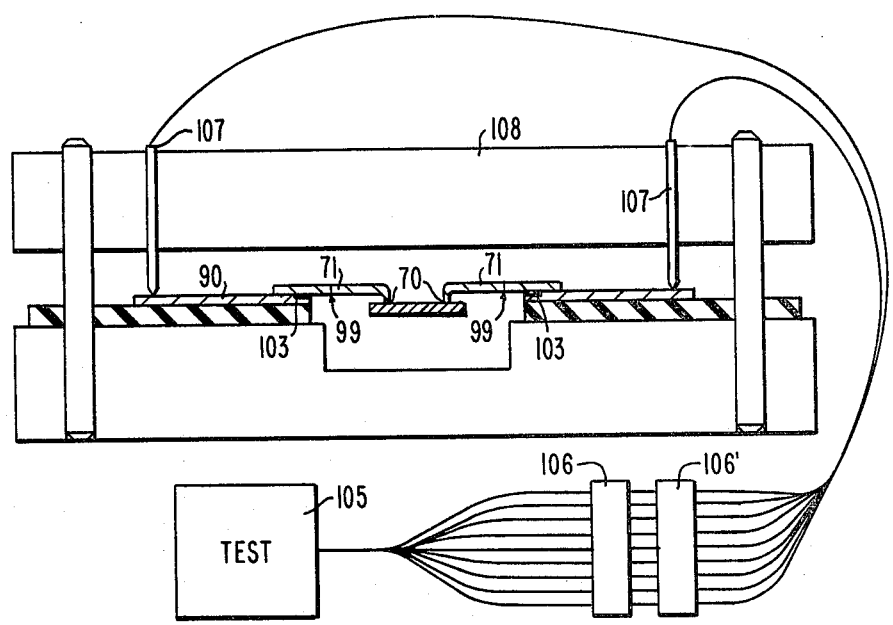
FIG. 14 illustrates a typical test set-up illustrating an IC chip being tested after the portion exterior of the bonded locations is removed.
Figure 15:
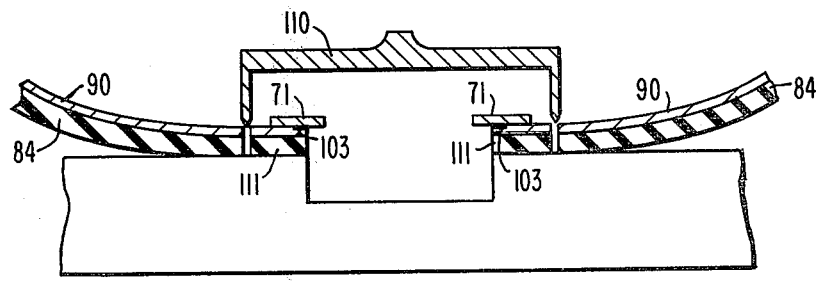
FIG. 15 is a diagrammatic cross-sectional view illustrating a typical severing of the bonds of FIG. 14 after the tested chip has been removed to enlarge the central opening such as is shown in FIG. 11 or 12.

Once the lead frame strip has been removed from the test tape, the individual leads 71 are no longer shorted together and the tape is ready for testing. Referring to FIG. 14, the double-layer test tape 83 with severed leads bonded thereto as previously described is shown in position for testing. A conventional test fixture 105 is connected through a coupling 106 to individual probes 107 on a fixture 108 to engage the appropriate individual metallic pads 88 and 88' of FIGS. 11 and 12. Once the chips have been tested, they may be severed in a conventional manner such as at 99 adjacent the peripheral edge of the central opening 87 of the test tape. This of course, leaves the bond between the outer portion of the individual leads of the lead frame still bonded adjacent the peripheral opening 87 to the metallic portion 90 of the test tape 83. Referring to FIG. 15, such bonded portion may be severed adjacent its exterior surface by a conventional punch 110 which is of similar configuraton to the central opening 87 but slightly larger sufficient to at least remove the alloy formation 103. The portion of the test tape referred to at 111 within the rectangular punch 110 is then discarded and the remaining portion of the test tape having a slightly larger central opening may be reused. To reuse the test tape a larger chip may be bonded at its free end to a custom lead frame having leads capable of registering with the metallic strips 90 of the tape and the procedure repeated. This procedure can continue for successively larger size chips with a larger number of leads until the central opening is made to its maximum size such as shown in FIG. 12. In actual practice, it is contemplated that as a minimum, the opening 87 may be enlarged sufficiently to expose two additional strips 90 for each incrementally larger size chip to be tested. With predetermined incremental enlargements, standardization of various sizes of chips to be tested can be effected.

The test fixture described in connection with FIG. 14 may have one contact probe for each of the pads 88, 88' even though many of the pads may not be connected to anything on the chip. The contact probes 107 of FIG. 14 and the connector portion 106' could be utilized for all of the different chips to be tested; that is, it could be set up originally to provide the proper contact for the pads 88 or 88' of the universal two layer test tape in accordance with the present invention. The mating connector 106 and the test device 105 of course would be different for each different chip.

Briefly, the conductive pattern 86 is made up of a large number of conductive lines 90 which extend toward the edge of the centrally spaced hole such as 87 and which connects to large probe pads such as 88 or 88' spaced away and exterior of the center clearance hole 87. The conductive lines terminate at the edge of the central opening 87 regardless of its size in the central portion of the insulative strip 84. The integrated circuit chips are testable after being bonded to the metallic lead frame strip by bonding the leads to the metallic strips as hereinbefore described by thermo-compression bonding; and the lead frame strip is removed and separated from the leads. It is to be noted that none of the metal that bonds the outer ends of each of the leads of the lead frame permanently remains with the chip and may therefore be metallized with a non-noble metallization in order to achieve moderate temperature eutectic alloy formation when the bonding of the leads to the test tape is accomplished. The conductive pattern of the universal test tape in accordance with the present invention may also be probed by the same probing pins during the testing operation regardless of the integrated circuit chip being tested.

The particular configuration for the art work and the resulting lead frame is specifically illustrated in order to provide an understanding of the present invention, that many other types of configurations may be utilized, and it is contemplated that the metallic lead frame strip may be customized depending upon the individual chip that is to be bonded.

What I claim is:

1. A method of manufacturing an elongated single layer, metallic tape having individual lead frames at spaced intervals along the length thereof, comprising:
   producing on a sheet of material a first art work pattern corresponding to a predetermined lead frame configuration for exposing a photoresist on one side of the metallic tape and a second art work pattern corresponding to a predetermined lead frame configuration for exposing the photoresist on the opposite side of said tape,
   said first and second art work patterns being aligned and oriented with respect to each other on said sheet such that said patterns are in correct registration with each other when the first pattern is superimposed on the second pattern by folding the single sheet along a predetermined fold line,
   stepping and repeating said sheet having the first and second art work patterns relative to an elongated photographic tape for generating a series of patterns including both said first and second patterns repeated at spaced intervals along the length of the tape, folding the tape lengthwise to superimpose each first art work pattern on each corresponding second work pattern in registration therewith,
   inserting an elongated strip of metallic foil having a photoresist on both sides thereof between the superimposed first and second art work patterns,
   exposing the photoresist on the metallic foil while interposed between said series of patterns
   developing said exposed photoresist,
   etching both sides of said metallic strip, and removing said exposed photoresist.

2. A method according to claim 1 further comprising the step of photoreducing the elongated strip of art work having the plurality of spaced first and second art work patterns with said photoreduction occurring on the line of symmetry between the first and second art work patterns, said step constituting the production of the developed art work for superimposing the first and second art work patterns.

3. A method of manufacturing lead frames that are spaced along the length of an elongated metallic tape wherein the leads of each spaced frame have at least one integral bonding bump adjacent their free ends for bonding to pads of an integrated circuit chip, said method comprising generating a first art work pattern representative of a predetermined lead frame configuration on a transparent sheet, generating a second art work pattern representative of the size and orientation of the bonding bumps of said lead frame configuration of the first art work pattern, producing a developed art work pair having a plurality of the first and second art work patterns spaced along the length thereof, placing the first and second art work patterns in registration with each other to position the bonding bumps of the second art work pattern in their desired position relative to the free end of the leads of the lead frame, interposing a metallic foil having a photoresist on both sides thereof relative to the first and second art work patterns to expose the photoresist on one side to the first art work pattern and the photoresist on the other side to the second art work pattern, and etching both sides of the photoresist patterned metallic tape sufficient to partially etch through that portion of the pattern having photoresist on only one side and to etch completely therethrough those portions of the pattern having no photoresist on either side thereof.

4. A method according to claim 3 further comprising generating on the second art work pattern a reference portion said reference being in a predetermined position relative to the bonding bump art work such that when the reference portion and the chip to be bonded are in proper registration, the bonding bumps of the leads of the lead frame and the bonding pads of the chip are in the correct position for bonding.

5. A method according to claim 4 wherein said reference portion is partially in registration and partially out of registration with the leads of the first art work pattern when the first and second art work patterns are in registration.

6. A method according to claim 4 wherein said reference portion has an edge conforming to at least two corners of the chip to be bonded.

7. A method of manufacturing lead frames that are spaced along the length of an elongated tape wherein the leads of each spaced frame have at least one integral bonding bump adjacent their free ends for bonding to pads of an integrated circuit chip, said method comprising:

producing a first pattern representative of a selected lead frame configuration on a transparent sheet, producing a second pattern that includes a representation of the size and orientation of the bonding bumps of said lead frame configuration on said transparent sheet oriented about a line of symmetry with respect to the first pattern such that when the transparent sheet is folded on its line of symmetry the two images register with one another, photoprinting in step and repeat fashion in the direction of the line of symmetry to produce a series of images of the first and second generated patterns on an elongated film, said film being oriented to position the first and second patterns in alignment side by side across the length of the film such that the first and second patterns are in proper registration when the double-width film is folded along the line of symmetry, separating the film lengthwise along the line of symmetry to permit superimposition of each of the first patterns with its corresponding second pattern, exposing an elongated single layer conductive metal foil covered with photoresist on both sides thereof between the superimposed patterns, and etching the exposed single layer metallic foil for a time sufficient to etch completely therethrough those areas of the conductive foil having no photoresist in alignment on either side and to etch partially those area having photoresist on only one side, while leaving substantially full thickness those areas having photoresist in alignment on both sides of the lead frame tape.

8. A method according to claim 7 where the step of generating said second pattern includes producing an additional reference pattern portion positioned in predetermined spaced relationship from the bonding bump portions to render a partially etched portion exterior of the position of the chip and spaced a predetermined distance from each of the bonding bump representations, said reference pattern being visible for registration with predetermined visible reference points on the chip to be bonded to said bonding bumps.

9. A method according to claim 8 wherein the reference pattern has an inner edge corresponding in position and contour to a portion of the peripheral surface of the chip to be bonded when the bonding bumps are in appropriate registration with the bonding pads of the chip.

10. A method according to claim 9 wherein the reference pattern inner edge conforms to at least two corners of the peripheral edge of the chip to be bonded.

* * * * *